United States Patent [19]

Schrenk

[11] 4,279,024
[45] Jul. 14, 1981

[54] WORD-BY-WORD ELECTRICALLY REPROGRAMMABLE NONVOLATILE MEMORY

[75] Inventor: Hartmut Schrenk, Haar, Fed. Rep. of Germany

[73] Assignee: Siemens Aktiengesellschaft, Berlin & Munich, Fed. Rep. of Germany

[21] Appl. No.: 47,746

[22] Filed: Jun. 12, 1979

[30] Foreign Application Priority Data

Jun. 30, 1978 [DE] Fed. Rep. of Germany ....... 2828855

[51] Int. Cl.³ ............................................. G11C 11/40
[52] U.S. Cl. .................................... 365/203; 365/218; 365/189; 365/230; 307/238.3
[58] Field of Search ................ 365/203, 218; 307/230, 307/238

[56] References Cited

U.S. PATENT DOCUMENTS 3,611,319  10/1971  Hyatt .................................... 365/218
4,148,044  4/1979  Roessler ............................... 365/218

FOREIGN PATENT DOCUMENTS 2743422  3/1927  Fed. Rep. of Germany .

OTHER PUBLICATIONS

IEEE Transactions on Electron Devices, vol. ED-24, No. 5, May 1977, pp. 584–588, 606–608.
Seimens Forsch–u En Twickle–Ber. Bd. 4(1975), No. 4, Springer 1975, pp. 213–219.

Primary Examiner—Terrell W. Fears
Attorney, Agent, or Firm—Hill, Van Santen, Steadman, Chiara & Simpson

[57] ABSTRACT

A word-by-word electrically reprogrammable nonvolatile memory has memory cells arranged in a matrix and provided with a control circuit, interconnected with the memory matrix in such a manner that variable erase and write durations are provided for each memory line. The termination of the variable durations is indicated by attainment of a predetermined erase or, respectively, write condition of one or more memory cells from the memory line to be erased or written. The erase or write condition of these cells is monitored during the erase or write duration of the memory line to provide a condition-effected termination of the variable duration.

13 Claims, 12 Drawing Figures

WORD-BY-WORD ELECTRICALLY REPROGRAMMABLE NONVOLATILE MEMORY

BACKGROUND OF THE INVENTION

1. Field of the Invention

The present invention relates to the word-by-word electrically reprogrammable nonvolatile memory having memory cells arranged in a matrix.

2. Description of the Prior Art

A floating gate memory cell or the construction of nonvolatile electrically reprogrammable memories is known from the IEEE Transactions on Electron Devices, Vol. ED-24, No. 5, May 1977, pp. 606–610, which is fully incorporated herein by this reference. In these field effect transistors, a floating memory gate, isolated on all sides, and a controllable control gate are arranged vertically above the channel segment, whereby the control gate covers the entire channel segment, whereas the floating gate covers only a portion of the channel segment. This so-called split gate structure avoids errors upon reading erased memory cells having a depletion character. The charging of the floating memory gate occurs by means of channel injection. To that end, electrons are accelerated in a short channel and fed to the memory gate by means of an additional electrical cross field. The discharging or erasing of the floating gate occurs by means of a back-tunneling of the electrons upon the application of a high electrical voltage between the control gate and a diffusion area.

In my U.S. patent application, Ser. No. 942,320, filed Sept. 14, 1978, corresponding to German patent application P 27 43 422.6, I disclose a word-by-word erasable nonvolatile memory constructed in floating gate technology. Both the charging and the discharging of the floating gate occurs by means of a direct transfer of electrons between the floating gate and the substrate, whereby a high electric field of suitable polarity is applied between the floating gate and the substrate.

A metal-nitride-oxide-semiconductor (MNOS) memory cell for the production of nonvolatile memories is known as an example for a holding memory from the publication Siemens Forschungs-and Entwicklungsberichte, Springer-Verlag, Vol. 4 (1974), No. 4, pp. 213–219. In this memory cell, a charge storage occurs by means of an electric transferring of traps on the interface between a nitride layer and an oxide layer. The charging and the discharging of the traps occurs by means of electron transfers through tunneling, given great electric field strength.

Memory cells which function in a manner similar to MNOS transistors are known from the publication IEEE Transactions on Electron Devices, Vol. ED-24, No. 5, May 1977, pp. 584–586, fully incorporated herein by this reference, in which, however, the layer sequence metallic gate electrode, nitride, oxide is replaced by means of transistors which have a layer sequence of polysilicon, oxynitride, nitride and oxide.

In all previously known memories which are constructed of the aforementioned memory cells, the erase or, respectively, programming time is permanently determined and adjusted by way of an external time element. The erase and programming times are to be selected so large that fluctuations of the erase and programming properties of the individual cells, caused for reasons of production technology, are taken into consideration not only within a chip, but also with respect to different fabrication batches. Moreover, the tolerance fluctuations of the time duration caused by means of the time element itself must also be taken into consideration. High programming and erasing times involve the danger of adjacent word interference and often also mean a deterioration of the programming memories, particularly in memory cells in which the write process occurs by means of channel injection. High write-erase times reduce the number of allowable write-erase cycles. In order to achieve minimum write-erase times and, therefore, to increase the life expectancy and the quality of corresponding semiconductor memories, it would be desirable to equip semiconductor memories in such a manner that an external time element is superfluous and to have only the fluctuations within one and the same chip have an influence in determining the write-erase duration, whereas fluctuations with respect to different semiconductor batches are not taken into consideration. By so doing, a significant reduction of the write-erase times can be achieved and the quality, as well as the life expectancy, of the memories concerned can be correspondingly increased.

SUMMARY OF THE INVENTION

It is therefore the object of the present invention to equip a nonvolatile memory, which is electrically reprogrammable on a word-by-word basis, in such a manner that an external time element is superfluous and the effective programming and erase times of the individual cells are reduced with respect to memories having external time elements.

The above object is achieved, in accordance with the present invention, in that a control circuit is interconnected with the memory matrix in such a manner that variable erase and write durations are provided for each memory line, the termination of which is indicated by means of the attainment of a predetermined erase or write condition, respectively, of one or more memory cells of the memory line to be erased or written, whereby the erase or write condition of one or more memory cells of the memory line is monitored during the erase or write duration, respectively, of this memory line.

A memory constructed in accordance with the present invention has the advantage over known memories that the external time element is eliminated and by so doing the entire arrangement for the operation of the memory becomes more simple and less expensive. The tolerance fluctuations of all component parts belonging to a time element, which must be taken into consideration upon determining the time constant, no longer enter into the write or erase durations of a memory constructed in accordance with the present invention and, therefore, no longer add to an increase of the write and erase durations.

In the construction of an external time element, tolerance fluctuations with respect to programming and erasing times of memory chips from different production batches must also be taken into consideration. Since, at most the fluctuations within a semiconductor chip enter into the programming or erasing times of a memory constructed in accordance with the present invention, the programming and erasing times of such a memory are also therefore advantageously reduced with respect to traditional memories having external time elements.

First, a reduction of the programming or erasing time of a memory is of advantage for the operation of such a memory. Second, a reduced reprogramming duration again has a positive feedback in respect of life expectancy of the memory. It is known that the programming and erase properties of a memory deteriorate with an increasing number of write-erase cycles. These deteriorations are caused, for example, by means of the oxide poisonings which hot charge carriers can effect or, by means of a fatigue phenomena of nitride layers. Shortened reprogramming times, therefore, mean an increased number of possible write-erase cycles and an increased life expectancy of a memory constructed in accordance with the present invention.

Moreover, the danger of an over-erasure, i.e. the shifting of the threshold voltages to strongly negative values, is reduced by means of a reduction of the erase times in floating gate memories. Thereby, possible difficulties upon the subsequent reprogramming process by means of channel injection can also be reduced.

Finally, the reduction of the reprogramming duration of a memory also leads to a reduced adjacent word interference than is the case in longer reprogramming times. Longer reprogramming times often effect the undesired writing or erasing of an information in individual cells of adjacent words, which leads to errors during the operation of memories.

A shortening of the programming and erase times again has the advantage of a shorter current load and, therefore, a lower heating of the semiconductor crystal. This advantage is of particular significance for such memories in which significant currents flow upon programming or erasing, such as for example, upon programming of memory cells by means of channel injection.

A further development of the invention resides in the provision of a control which is interconnected with the memory matrix in such a manner that, for achieving a variable erase duration of a memory line and for the control of the erase condition of one or more memory cells of the line to be erased, the erase voltages applied to the memory cells are subdivided into a temporal sequence of individual pulses so that a read-after-write test is respectively inserted in the time intervals between the pulses.

In memory cells which have no erase area electrically insulated from the channel area, a simultaneous erasure and read-after-write test is not possible insofar as, for example, in n-channel memory cells, a high positive voltage must be applied for erasure at the source, whereas the source must be grounded for the read-after-write test. The corresponding case holds true in p-channel technology, in respect of interchanged operational signs of the applied voltages. These two conditions cannot be met simultaneously. A subdivision of the erase voltage into a temporal sequence of individual pulses, however, renders possible the simultaneous provision of such operations, that is a read-after-write test during the pauses between erase pulses. The subdivision of the erase voltage into a temporal sequence of individual pulses is of particular significance for the mentioned type of memory cells.

This, however, does not exclude the fact that cells which have an electrically insulated erase window available above the channel area cannot also be erased by means of a sequence of erase pulses, even though an erasure by means of a temporally constant erase voltage is possible for such cells. Such cells are disclosed, for example, by Bernward Roessler, in his U.S. Pat. No. 4,148,044, issued Apr. 3, 1979, and fully incorporated herein by this reference. Since the crystal hearing is lower in a pulse-wise erase, the employment of erase pulses, for example, can also be advantageous in cells having insulated erase windows.

It is advantageous that a control is interconnected with the memory matrix in such a manner that the erase duration of a memory line is terminated when all memory cells at which a read-after-write test is undertaken exhibit a threshold voltage of $U_T$, whereby $|U_T|$ is smaller than or equal to $U_{GL}$, where $|U_{GL}|$ signifies a predetermined threshold value of the memory cells employed.

This condition can be realized, for example, in memory cells constructed in n-channel technology, as follows.

A memory cell is blocked in the unerased condition, in case a sufficiently high positive voltage is not applied to its control gate. If, for example, the erasure is carried out toward the source, then a high positive voltage pends at the source during the erase pulses, whereas the control gate is grounded. By means of a suitable circuit, a certain, a very high positive voltage, is always provided at the drain, which voltage is precisely so large that it is sufficient for reading and for the read-after-write test of the cells. At the beginning of the erase process, as long as the threshold voltage $|U_T|$ is greater than the predetermined threshold value $|U_{GL}|$ the cell to be erased also remains blocked during the erase pulse pauses. If, however, after a few erase pulses, the threshold voltage decreases to such an extent that it achieves or falls below the value $|U_{GL}|$, then the cell is conductive in the next following pulse pause. Since the source of a cell is grounded during the pulse pauses and the drain, on the other hand, is always charged with a certain positive voltage which is sufficient for reading and for the read-after-write test, a current now flows through the cell. This current of one or more memory cells, at which the read-after-write test is carried out, can again be employed as the signal for the termination of the erase duration of the selected word. The memory cells, therefore, are only erased until the condition "0" has just been reached, with an adjustable safety interval.

In specific cells, it is also advantageous that a control is interconnected with the memory matrix in such a manner that the variable erase duration is achieved by means of a temporally continuous applied erase voltage and by means of a simultaneous read-after-write test, whereby the erase duration of a memory line is terminated when all memory cells at which the read-after-write test has been carried out exhibit a threshold voltage $U_T$ for which the relationship $|U_T| \leq |U_{GL}|$ holds true.

A continuous erasing and simultaneous reading can be carried out in memory cells of the floating gate type which have an erase window electrically insulated from the channel area, so that the source voltage can also amount to 0 volt during the entire erase duration, whereas the insulated diffusion area in the erase window exhibits a high positive voltage. Such a cell is described in the aforementioned U.S. Pat. No. 4,148,044.

It is also advantageous that a control circuit is interconnected with the memory matrix in such a manner that, for achieving a variable write duration of a memory line and for the control of the programming condition of one or more memory cells of the memory line to be programmed, the programming voltages applied at the memory cells are subdivided into a temporal sequence of individual pulses so that a read-after-write test is respectively inserted in the pulse pauses. The subdivision of the programming duration into individual pulses has the advantage, particularly in cells which are programmed with channel injection, that the heating of the semiconductor chip by the high channel currents is thereby reduced.

A read-after-write test at a cell to be programmed during the pulse pause has the further advantage for all cells employed that the programming duration of the cell can be adapted to the programming time actually required for that cell. Thereby, the threshold value of a cell to be programmed is not significantly shifted above an upper-predetermined nominal value of the threshold voltage. There again occurs therefrom the advantage of a shorter programming time and, as a result, a reduced damage of the semiconductor cells, which again leads to an increase life expectancy and increased plurality of write-read cycles. Damage to memories constructed in accordance with the present invention which occur because of reprogramming do not, as in other memories, lead to possible total failures, but rather only continuously increase the write-erase times.

A further development of the invention is that a control circuit is connected with the memory matrix in such a manner that the write duration of the memory line is terminated when all memory cells at which a read-after-write test is carried out have a threshold voltage of $|U_T|$ which is greater than or equal to a potential $|U_{GS}|$.

A further development of the invention resides in the fact that, during the erase condition and within a read-after-write test with a gate voltage $U_{GL}$, the erased condition is indicated by means of the decreasing of the absolute value of the drain voltage $|U_D|$ and, during the write duration and withi a read-after-write test with a gate voltage $U_{GS}$, the programmed condition is indicated by means of the increase of the drain voltage $|U_D|$.

It is advantageous that a control circuit is interconnected with the memory matrix in such a manner that those drain output signals which indicate the end of the write duration or an erase duration of a memory line are employed for switching off the write or erase voltage applied to the appertaining memory line.

A particular feature of the invention is the utilization of electrically reprogrammable field effect transistors constructed according to the floating gate principle or according to the MNOS principle for the construction of the individual memory cells.

It is advantageous from a technical circuit point of view that the gate lines of the field effect transistors employed for the construction of the memory cells are connected on a word basis and the appertaining drain lines are connected on a bit basis.

It is also advantageous that a control circuit is interconnected with the memory matrix; that the gate voltages which are required as predetermined threshold voltages ($U_{GS}$ and $U_{GL}$) for the read-after-write test upon programming and erasing, as well as the gate voltage ($U_{GR}$) for reading of the memory are derived from one and the same voltage divider so that the voltage $|U_{GL}|$ is smaller than the voltage $|U_{GR}|$ and, at the same time, the voltage $|U_{GR}|$ is smaller than the voltage $|U_{GS}|$ at all times.

The above measure advantageous guarantees a secure minimum interval between the gate voltage $U_{GR}$ upon reading and the threshold voltage $U_T$("0") of the programmed condition, whereby $|U_T ("1")| > |U_{GR}|$ holds true or, respectively, of the threshold voltage $U_T$ ("0") of the erase condition of a memory cell, whereby $|U_T ("0")| < |U_{GR}|$ holds true. With these relationships, one can always read the memory with safety. Different tolerance-conditioned write and erase properties of the memory cells within a memory do not affect the reliability upon reading the memory, but, rather only effect the duration of the write or, respectively, erase process. Because the unprogrammed and programmed conditions can be very precisely determined relative to the reading voltage with this measure, the width of the electric window, i.e. the potential difference between the gate voltage upon a read-after-write test during the writing voltage $U_{GS}$ and the gate voltage upon a read-after-write test during the erasing voltage $U_{GL}$, can be reduced. Thereby, in an advantageous manner, either the voltages during the reprogramming can be low or, also, the reprogramming duration is particularly short. Further, with this measure, the electric window can be placed into a predetermined threshold voltage range.

BRIEF DESCRIPTION OF THE DRAWINGS

Other objects, features and advantages of the invention, its organization, construction and operation will be best understood from the following detailed description, taken in conjunction with the accompanying drawings, on which.

The examplary embodiments illustrated on the drawings refer to n-channel technology. However, analogous exemplary embodiments, as is readily apparent, are also possible in p-channel technology.

DESCRIPTION OF THE PREFERRED EMBODIMENTS

Figure 1:
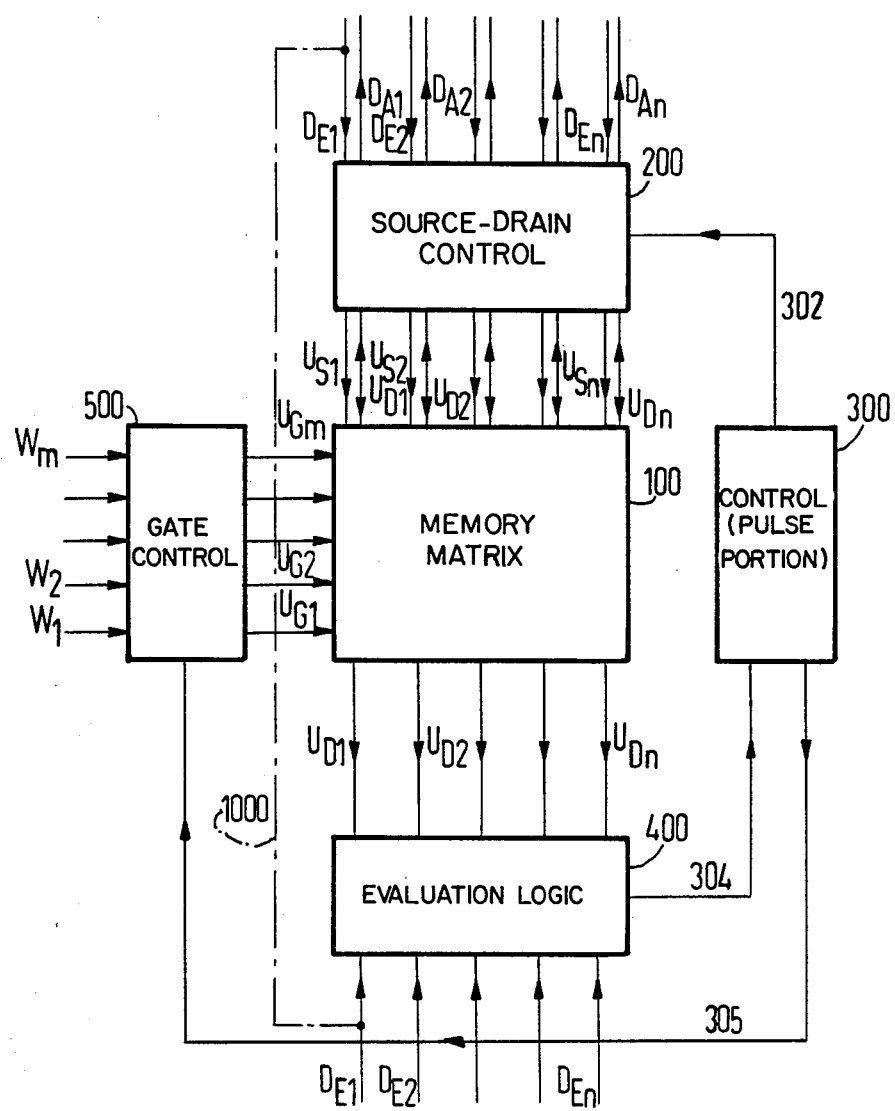
FIG. 1 is a block diagram of a memory system constructed in accordance with the present invention.

Referring to FIG. 1, a memory constructed in accordance with the present invention is illustrated in which there is provided a memory matrix 100 having m lines and n columns. A source-drain control 200 is connected to the memory matrix 100, which provides the source voltages $U_{S1}$-$U_{Sn}$ and the drain voltages $U_{D1}$-$U_{Dn}$ (indicated by means of arrows between the memory matrix 100 and the source-drain control 200). The arrow direction is intended to indicate the side of the connection lines proceeding from which the voltage concerned is applied. The opposite arrow direction for the voltages $U_{D1}$-$U_{Dn}$ indicates that the drain voltages are determined either directly by way of a drain control or also indirectly given in electrically floating drain by way of the source control. On the other hand, the drain voltages $U_{D1}$-$U_{Dn}$ of the memory matrix 100 are also connected to an evaluation logic 400 (indicated by means of arrows between the memory matrix 100 and the evaluation logic 400). The inputs $D_{E1}-D_{En}$ of the evaluation logic 400, as well as the source and drain control 200 are connected with one another in an electrically conductive manner. For reasons of simplicity and clarity, this electrically conductive connection of the data inputs of the evaluation logic 400 and the source and drain control 200 has only been indicated for the data input of the first column $D_{E1}$ in FIG. 1 by means of the dot-dash line 1000. The data outputs $D_{A1}-D_{An}$ (illustrated by means of arrows) which lead out of the source-drain control 200 are fixed by means of the level of the drain voltages $U_{D1}-U_{Dn}$. The gate voltages of the gate lines of the memory matrix 100, which are controlled on a word basis, are supplied with suitable potentials $U_{G1}-U_{Gm}$ by means of a gate control 500. The selection lines of a line decoder $W_1-W_m$ are connected into the gate control 500, so that a suitable word selection can be undertaken. The control circuit with the pulse portion 300 feeds the required pulses into the source and drain control 200 by way of the line 302 and, correspondingly, into the gate control 500 by way of a line 305. Lines 304 connect the evaluation logic 400 together with the control circuit to the pulse portion 300, whereby the evaluation logic 400 also influences the time duration of the pulse delivery of the control circuit having the pulse portion 300.

Figure 2:
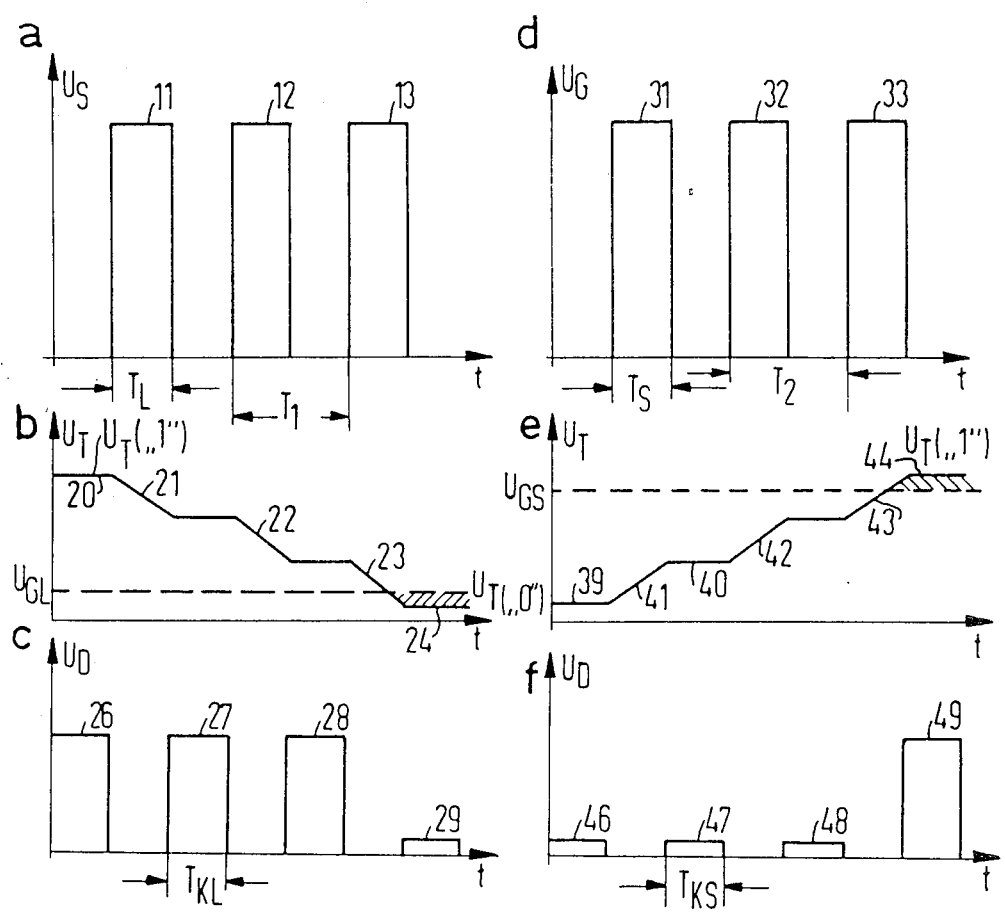
FIGS. 2a-2g are graphic representations of erase-write, read-after-write test and read pulses.
Figure 2:
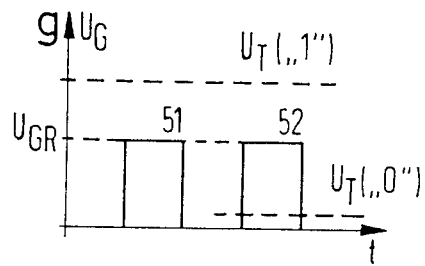

In FIG. 2, the pulses for a control are illustrated, in which the erasing and the writing of the memory cells does not occur traditionally during a predetermined time duration, but rather within predetermined threshold voltage values, between the threshold voltage value $U_T("0")$ of a reprogrammed memory cell and $U_T("1")$ of a programmed memory cell. Erase pulses according to FIG. 2a effect a threshold voltage 24 which decreases step-by-step, which is illustrated in FIG. 2b, during the erase pulse duration. The read-after-write test pulses during the erasing process occur in the pauses between erase pulses.

The analogous case is true of the write process, as can be seen from FIGS. 2d-2f.

In FIG. 2a, the source voltage pulse $U_S$ are illustrated as a function of time t. Rectangular pulses 11, 12, 13 are supplied to the source of a selected cell for the purpose of erasing. The duration of an erase pulse is designated $T_L$. The time duration from the beginning of an erase pulse to the beginning of the next successive erase pulse amounts to $T_1$. The duration of the pulse pause between two successive erase pulses therefore amounts to the value of $T_1-T_L$. FIG. 2b illustrates the change of the threshold voltage of a selected cell during the erase duration of this cell, whereby the erasing occurs by means of pulses applied according to FIG. 2a. The threshold voltage curve 20 of an initially unerased cell exhibits a high threshold value $U_T("1")$ at the beginning of the erase process. Each erase pulse effects a decrease of the threshold voltage value of the selected cell to be erased. Therefore, for example, the pulse 11 of FIG. 2a effects a decrease 21 of the threshold value $U_T$, the pulse 12 effects a decrease 22 and the pulse 13 effects a decrease 23 of the threshold value $U_T$. A selected cell is erased when its threshold voltage value $U_T("0")$ falls below and applied gate voltage $U_{GL}$ upon the read-after-write test during the erase process. This criteria is met for the final value 24 of the threshold voltage curve 20, whereby $U_T("0") < U_{GL}$.

FIG. 2c illustrates the drain voltages of a selected memory cell during the erasing process, at which the read-after-write test is carried out in the erase pulse pauses during a time duration $T_{KL}$. The drain voltage during the duration of an erase pulse $T_L$ can assume very different values depending on the construction and type of the memory cell employed. For the sake of simplicity and clarity, these drain voltages are not indicated in FIG. 2c. During the duration of a read-after-write test process in the erase phase $T_{KL}$, the drain voltage values 26, 27, 28 of a selected memory cell lie at a high level until the threshold value of the cell has fallen below a certain critical value. This critical value can be derived from FIG. 2b and amounts to the value $U_{GL}$, which corresponds to the gate voltage upon the read-after-write test during the erasure at the cell to be erased. If the threshold voltage of the cell to be erased falls below the value $U_{GL}$, then the drain voltage value of the cell decreases to the value 29 (spontaneously greatly decreases), i.e. the cell becomes conductive. This spontaneous decrease of the drain voltage of one or more cells of a memory to be erased can be employed to terminate the erase process.

Gate voltage pulses $U_G$ are illustrated in FIG. 2d as a function of time t. A plurality of rectangular pulses 31, 32, 33 are supplied to the gate of a selected cell in order to write an information into the cell. The duration of a write pulse amounts to $T_S$. The time duration from the beginning of the write pulse and to the beginning of the next successive write pulse amounts to $T_2$, so that the duration of the pulse pause between two successive write pulses amounts to $T_2-T_S$.

FIG. 2e illustrates the change of the threshold voltage of a selected cell during the write duration of this cell, whereby the write process occurs by means of pulses according to FIG. 2d. The threshold voltage in curve 40 of an originally erased cell exhibits a low threshold voltage value 39 at the beginning of the write process, the threshold voltage value $U_T("0")$ of an unprogrammed cell. Each write pulse effects an increase of the threshold voltage value of the cell to be written. Therefore, the pulse 31 of FIG. 2d effects an increase 41 of the threshold voltage $U_T$, the pulse 32 effects an increase 42 of the threshold voltage $U_T$ and the pulse 33 effects an increase 43 of the threshold voltage $U_T$. The write process is terminated when the threshold voltage value of a selected cell lies above a certain gate voltage $U_{GS}$ pending upon the read-after-write test. This criteria is fulfilled for the final value 44 of the threshold voltage $U_T$, the value $U_T("1")$ in the curve 40, whereby $U_T("1") > U_{GS}$.

FIG. 2f illustrates the drain voltage $U_D$ during the write process of a selected memory cell in which the read-after-write test is carried out in the write pulse pauses during a time duration $T_{KS}$. As in FIG. 2c, FIG. 2f also only illustrates the drain voltage during the duration of the read-after-write test in the write phase $T_{KS}$, not, however, during the interval of the write pulse $T_S$. During the write process, the drain voltage values 46, 47, 48 of a selected memory cell lie at a low level, i.e. the selected cell is connected through in a conductive manner, until the threshold value of the cell has risen above a certain critical value. This critical value may be derived from FIG. 2e and amounts to the value $U_{GS}$, which corresponds to the gate voltage upon the read-after-write test during the write process at the selected cell. If the threshold voltage of the selected cell exceeds the value $U_{GS}$, then the drain voltage value 49 of the selected cell spontaneously greatly increases, i.e. the cell no longer conducts. This spontaneous increase of the drain voltage of a selected cell of a memory can be employed to terminate the write process.

Figure 4:
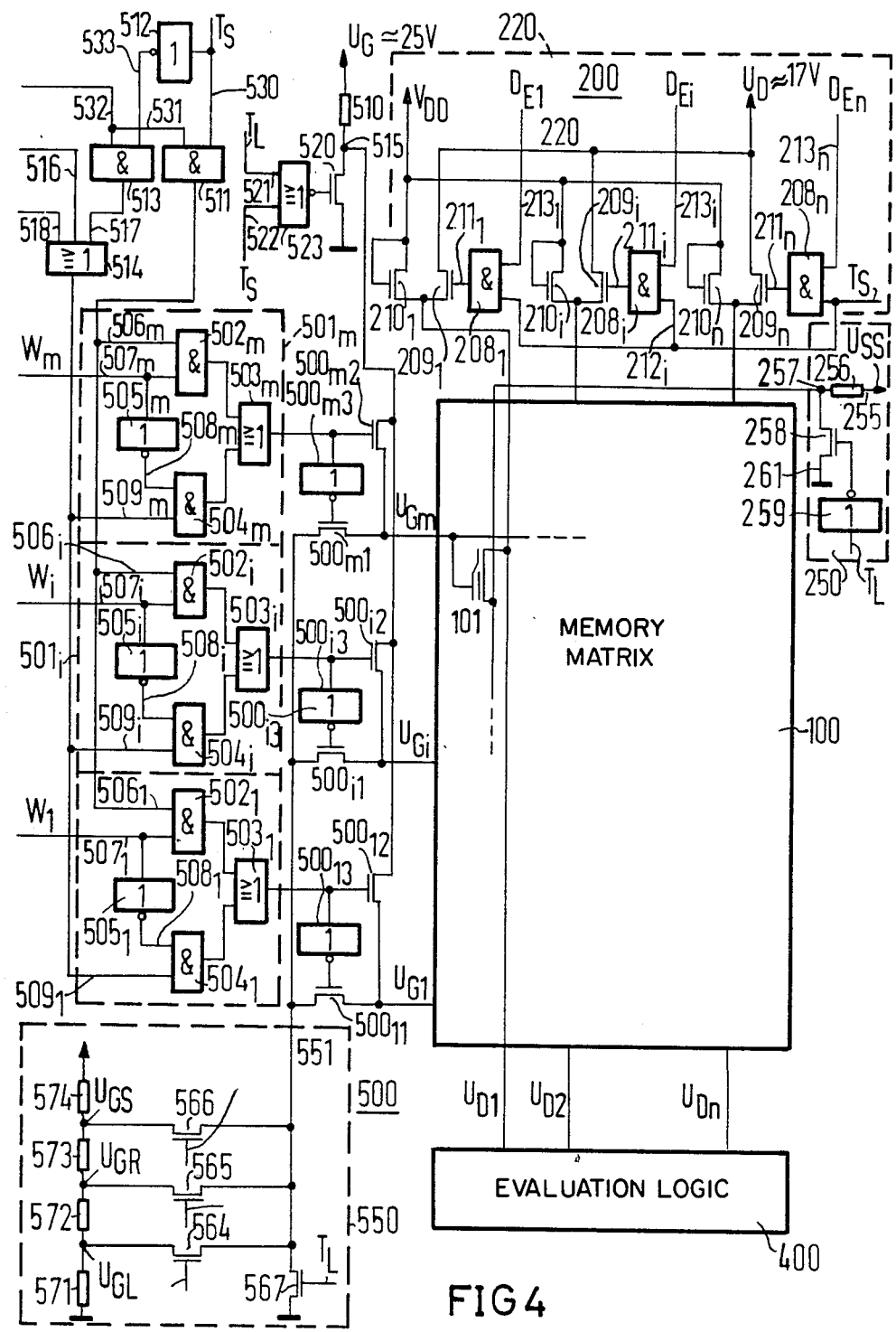
FIG. 4 is a schematic logic diagram of a gate control circuit for memories constructed in accordance with the present invention and source and drain control circuits for memories having cells which are charged by the channel injection technique.

FIG. 2g illustrates the gate voltage $U_G$ of a selected memory cell during the reading process as a function of time t. The rectangular pulses 51, 52 respectively exhibit the same potential level, in particular, the gate reading voltage $U_{GR}$. This voltage lies between the threshold voltage $U_T$ ("1") of a memory cell inscribed with a "1" and the threshold value $U_T$ ("0") of a memory cell inscribed with a "0". In FIG. 4, among other things, it is explained in greater detail how a sufficiently safe interval between the reading voltage $U_{GR}$ and the threshold voltage $U_T$ ("1") of a charged cell, on the one hand, and the threshold voltage $U_T$ ("0") of an erase memory cell can be safely observed from a circuit technical point of view.

In FIG. 2, the writing and erasing of information in selected cells is realized by means of respective write and erase pulses, as illustrated. In specially designed memory cells, as are described in the aforementioned U.S. Pat. No. 4,148,044, in which the charge transfer in a floating gate memory occurs outside of the channel area in an electrically insulated erase area or erase window, the erase process and the read-after-write test can occur simultaneously. Therefore, a static erasure is also possible for this exemplary embodiment of the invention. In this case, also, the erase voltage is switched off by means of a suitable evaluation logic and a control circuit at the moment at which the threshold value of the cell to be erased falls below a predetermined lower threshold voltage value.

Figure 3:
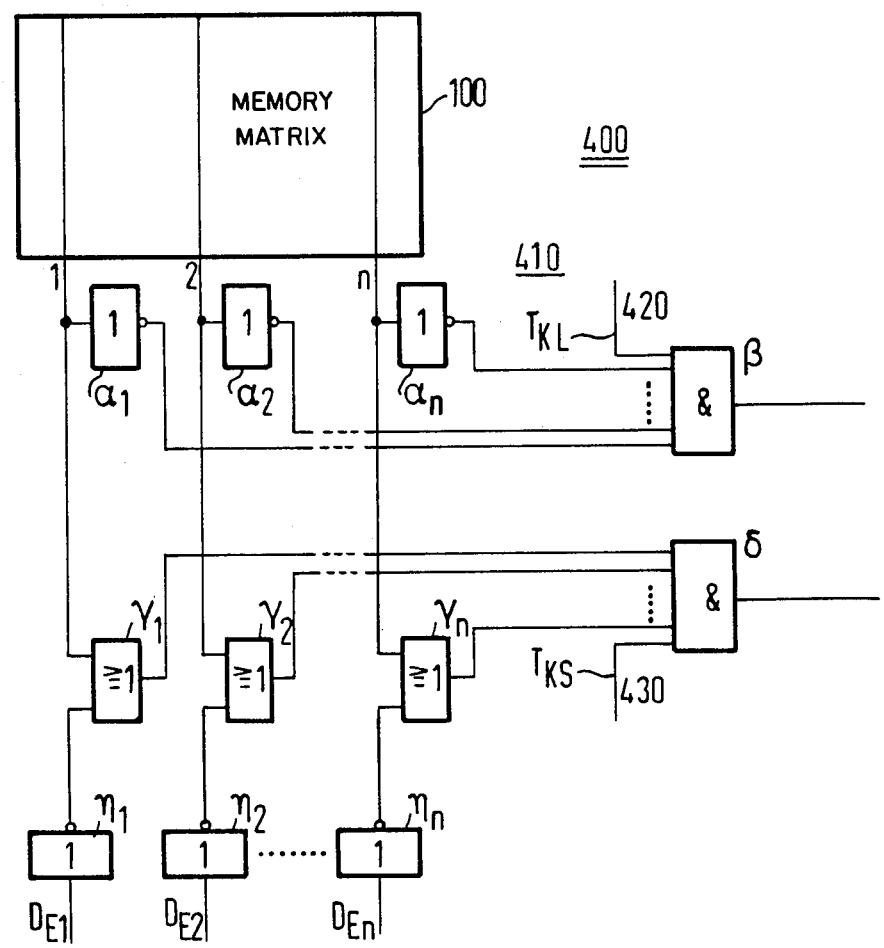
FIGS. 3 and 3a are separate examples of an evaluation logic for memories constructed in accordance with the present invention.
Figure 5:
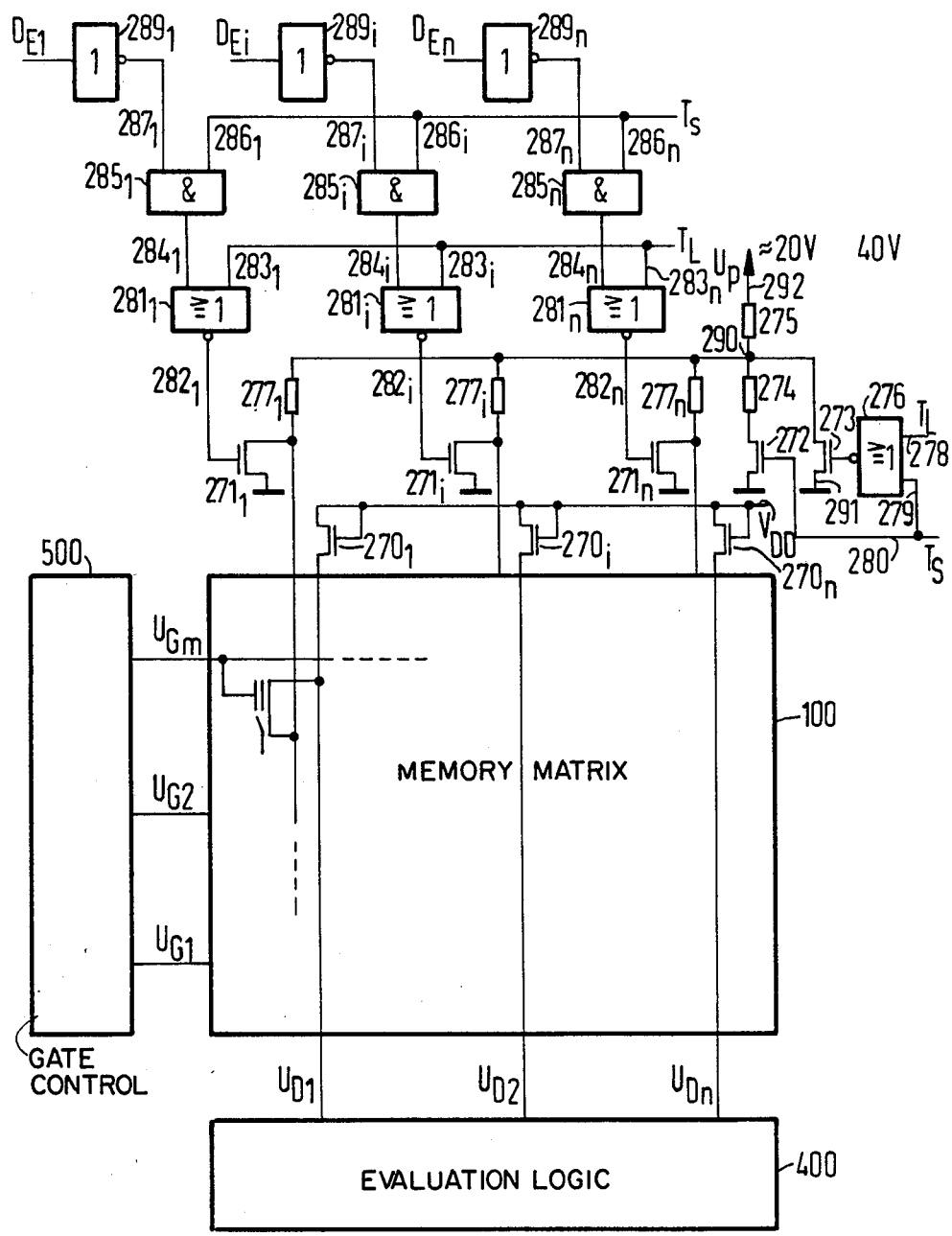
FIG. 5 is a schematic logic representation of a source and drain control circuit for memories constructed in accordance with the invention in which the memory cells are charged by means of strong electric fields between the memory gate and a diffusion area.

The reference characters $T_S$ and $T_L$ at various connections of FIGS. 3, 4 and 5 indicate that a sufficiently high positive voltage, i.e. a "1" is applied at the corresponding circuit reference at this connection during the write pulse duration or, respectively, during the erase pulse duration. The same holds true for the reference character $T_{KL}$ or, $T_{KS}$ for the duration of a read-after-write test process during the erase or, respectively, write pulse pauses. The terms "write", "erase" and "read" mean that corresponding positive voltages are applied at the corresponding connections during the entire write, erase, or, respectively, read duration. These terms also indicate the delivery of a voltage signal at the point in time of the end of the erase or, respectively, write process.

Figure 3A:
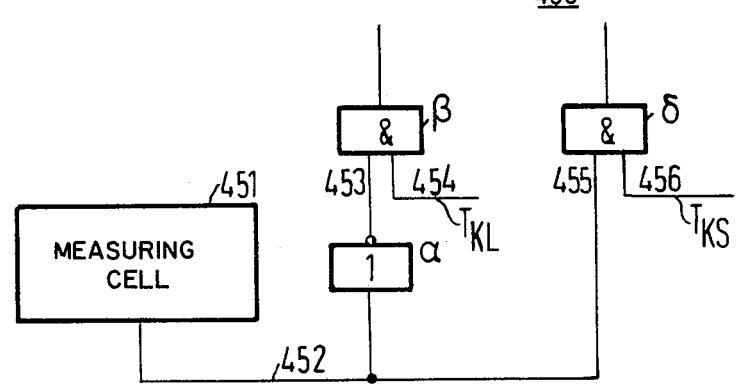

Referring now to FIG. 3 and 3a, two examples of an evaluation logic are provided, which examples may be utilized in practicing the present invention. In the logic circuit diagram 410 of FIG. 3, all drain lines 1-n which are connected on a bit basis extend out of the memory matrix 100. The drain lines 1-n connected bit-wise extend, on the one hand, via a respective inverter $\alpha_1$–$\alpha_n$ to an AND gate $\beta$, on the other hand, by way of a respective OR gate $\gamma_1$–$\gamma_n$ to an AND gate $\delta$. Additionally, the data inputs $D_{E1}$–$D_{En}$ are applied, via a respective inverter $\eta_1$–$\eta_n$, to corresponding OR gates $\gamma_1$–$\gamma_n$. For reasons of simplicity and clarity, only the first, the second and the n$^{th}$ drain lines are illustrated with the appertaining switching symbols. It is also seen that the AND gate $\beta$ is released only during the duration of the read-after-write test process in the erase pause, i.e. during the time $T_{KL}$, which can occur, for example, by means of a further connection 420 at the AND gate $\beta$, which respectively carries a positive voltage during the duration of the read-after-write test upon erasing and, therefore, applies a "1" to the AND gate $\beta$, whereas it conducts no voltage at other times and, therefore, applies a "0" at the AND gate $\beta$. Analogously, a connection 430 provides that the AND gate $\beta$ is only released during the duration $T_{KS}$ of the read-after-write test process in the write phase. Therefore, voltage pulses are applied to the connection 430 which carry a positive voltage during the duration $T_{KS}$ and therefore apply a "1" to the AND gate $\delta$, whereas they apply a "0" to the AND gate $\delta$ in the appertaining read-after-write test pauses and, therefore, do not release the gate during this time. During the duration $T_{KL}$ of the read-after-write test in the erase phase, the connection 420 first applies a "1" to the AND gate $\beta$. During the erase process of the selected word, those memory cells respectively deliver a "0" to their appertaining drain lines i (i=1 ... n) connected bit-wise when their threshold values according to FIG. 2b have fallen below a predetermined lower voltage value $U_{GL}$. After attaining this condition at all cells of the selected word, all drain lines 1–n therefore deliver a "0". Therefore, a "1" appears at each input of the AND gate $\delta$ by way of the appertaining inverter $\alpha_1$–$\alpha_n$ and, therefore, the end of the control signal appears at the output of the AND gate $\delta$ which is then relayed to the control circuit having the pulse portion 300 from FIG. 1 as a voltage pulse, whereby, again, a further pulse delivery of the control circuit 300 to the control 200 is interrupted. Therewith, the erase process for the selected word is terminated.

Upon writing a selected word, the 1–n drain lines connected bit-wise are connected by way of a respective OR gate $\gamma_1$–$\gamma_n$ to a common AND gate $\delta$. In addition to the appertaining drain line i (i=1 ... n), the appertaining data input $D_{Ei}$ (i=1 ... n) is likewise respectively supplied by way of a further inverter $\eta_i$ (i=1 ... n) to the OR gates $\gamma_i$ (i=1 ... n). If the cell i is provided with an information, then the i$^{th}$ drain line, connected bit-wise, carries a sufficiently great positive drain voltage, i.e. a "1" to the OR gate $\gamma_i$ after the charge of the corresponding cell has been terminated. On the other hand, the second input of the OR gate $\gamma_i$ is supplied with a "0" since the appertaining data input $D_{Ei}$ exhibits a "1" which is converted into a "0" by means of the interposed inverter $\eta_i$, which "0" then reaches the second input of the OR gate $\gamma_i$. The output of the OR gate $\gamma_i$, therefore, emits a "1" to the AND gate . A second memory cell into which a "0" is inscribed, always emits the information "0" by way of its drain line j connected bit-wise to the appertaining OR gate $\gamma_j$, since the drain voltage of this cell does not rise. The corresponding data input $E_{Ej}$ feeds a "0" to the inverter $\eta_j$, which again supplies a "1" to the second input of the OR gate $\gamma_j$. The output of the OR gate $\gamma_j$, therefore, likewise emits a "1" to the AND gate $\delta$. All cells of the selected word into which a "0" is written therefore supplies a "1" to the appertaining input of the AND gate $\delta$ from the beginning of the write process. All remaining memory cells of the selected word, in which a "1" is written in, then deliver a "1" to the input of the AND gate $\delta$ when the writing-in process in the corresponding cell is terminated. The further connection 430 at the input of the AND gate $\delta$ supplies a "1" to the input of the AND gate $\delta$ during the duration of each read-after-write test process in the write phase, i.e. during the interval $T_{KS}$. Thereby, it is guaranteed that a read-after-write test is only carried out in the write pulse pauses. After termination of the write process of the slowest selected memory cell into which an information is written, all inputs of the AND gate δ exhibit a "1". The write end is thus indicated by means of a "1" as the output signal of the AND gate δ. This output signal is fed from the evaluation logic 400 by way of a line 304 into the control circuit having the pulse portion 300 (cf. FIG. 1) and there effects a termination of the delivery of write pulses to the gate control 500. The write process is thus terminated.

Upon integration in metal-oxide-semiconductor (MOS) technology, NOR gates are advantageously employed instead of the AND gates β, or, respectively, δ, whereby the logic connected in front is appropriately changed.

The logic circuit diagram 450 of FIG. 3a is a simplified embodiment of the evaluation logic illustrated with the logic circuit diagram 410. In FIG. 3a, a single measuring cell 451 is applied on a chip adjacent the remaining cells of a memory matrix. The write or, respectively, erase behavior of this measuring cell 451 is viewed as being representative for the write or, respectively, erase behavior of all cells on the chip. The end of the write duration or of the erase duration of the measuring cell 451 at the same time signals the write or, respectively, erase end of all cells of a selected word. The measuring cell 451 is fed during a write or erase process with the same write or erase pulses as corresponding cells of a selected memory word. In the pulse pauses, however, the read-after-write test is carried out only at the measuring cell 451. To that end, the drain line 452 is connected out of the measuring cell 451 and extends, on the one hand, to the connection 453 of an AND gate β by way of an inverter α and, on the other hand, to a connection 455 of an AND gate δ. Moreover, the AND gate β contains a connection 454 which supplies a "1" to the AND gate β in the erase pulse pauses during the read-after-write test duration $T_{KL}$, whereas it supplies a "0" to the AND gate β in the remaining time. Analogously, the AND gate δ contains a connection 456 which supplies a "1" to the gate during the duration of the read-after write test in the write pulse pauses, but supplies a "0" at all other times. If erase pulses are supplied to the measuring cell 451, then its threshold value decreases continuously. Below a certain limiting value, the measuring cell 451 becomes conductive, i.e. the drain line 452 emits a "0" to the inverter α upon a read-after-write test and this, in turn, emits a "1" to the connection 453 of the AND gate β. Since the connection 454 likewise conducts a "1" during the read-after-write test duration $T_{KL}$ during the erase pulse pauses, the AND gate β likewise emits a "1" as an output signal, whereby the erase end is signaled. If, in this case, one feeds the output of the AND gate β by way of a line 304 into the control circuit having the pulse portion 300 (cf. FIG. 1), then the pulse delivery of the control circuit 300 to the control 200 can be switched off with such pulse. The erase end of the measuring cell 451 therefore effects the erase end of the selected memory cells. If, on the other hand, the measuring cell 451 is supplied with write pulses at the same time as the selected cells of the memory matrix, then the threshold value of the measuring cell 451 increases (cf. FIG. 2e). When the threshold value exceeds a specific predetermined value, then the drain voltage rises greatly in the pulse pauses. The drain line 452, therefore, applies a "1" to the connection 455 of the AND gate δ. On the other hand, a "1" also appears at the connection 456 of the AND gate δ during the read pulse duration $T_{KS}$ in the write pulse pauses. The output of the AND gate δ thus emits a "1" by way of the line 304 to the control circuit having the pulse portion 300 (cf. FIG. 1), whereby a further delivery of write pulses to the control circuit having the pulse portion 300 to the gate control 500 is switched off. The write duration of all selected cells of the memory matrix 100 is therefore terminated at the same time as the write duration of the memory cell 451. However, the employment of a single measuring cell is only meaningful when the tolerance-conditioned fluctuations of the erase and programming properties of all memory transistors within a memory are sufficiently small.

A column of memory cells having a drain line connected bit-wise can also be employed instead of a single measuring cell. Each selected word of a memory matrix then has available a separate measuring cell which respectively signals the ends of the write and erase durations of all cells of a selected word in a manner analogous to the circuit of the measuring cell 451.

FIG. 4 illustrates a gate, drain and source control for a memory matrix 100 which is constructed of floating gate memory cells 101 having a split gate structure. As initially described, the memory cells are loaded by means of channel injection, whereas the discharge of the floating gate of the memory cell occurs upon a high electric voltage applied between the control gate and a diffusion area by means of back-tunneling electrons from the floating gate into the diffusion area. The illustrated gate control 500 is constructed in such a manner that the duration of a read-after-write test process in the erase pulse pause $T_{KL}$ precisely fills out the entire pulse pause between two successive erase pulses, i.e. that the time $T_{KL}$ was equal to the difference $T_{1-TL}$ (cf. FIGS. 2a and 2c). The corresponding case holds true for the duration of a read-after-write test process in the write phases process in the write phases $T_{KS}$ with reference to the appertaining write pulse pauses. This selection of the read-after-write test duration in the write process as well as in the erase process is not absolutely necessary. It must only be assured that the read-after-write test respectively occurs within the write or, respectively, erase pulse pauses, i.e.

$$T_{KL} \leq T_1 - T_L \text{ or } T_{KS} \leq T_2 - T_S.$$

For reasons of simplicity and clarity, only the gate control of the first, $i^{th}$ and the $m^{th}$ lines, as well as the source and drain control of the first, of the $i^{th}$ and of the $n^{th}$ column have been illustrated in FIG. 4. The control of the remaining lines and columns occurs in the same manner.

By means of a selection logic $501_i$, the gate voltage $U_{Gi}$ at the $i^{th}$ (i-1-m) memory gate of the memory matrix 100 is either applied by way of a transistor $500_{i2}$ to the voltage of the point 515 or is connected by means of an inverter $500_{i3}$ by way of the transistor $500_{i1}$ to a voltage divider 550. The selection logic $501_i$ is composed of a NOR gate $503_i$ whose output is applied to the gate of the transistors $500_{i2}$ or, respectively, to the gate of the transistor $500_{i1}$ by means of the interposition of an inverter $500_{i3}$. The NOR gate $503_i$ has two inputs which are, in turn, connected with the outputs of two AND gates $502_i$ and $504_i$. The AND gates $502_i$ and $504_i$ each have two inputs, whereby one input of the AND gate $502_i$ is connected with an input of the AND gate $504_i$ by way of an inverter $505_i$.

In the following, it is to be illustrated how the gate control 500 realizes all possible conditions for erasing, writing, read-after-write test and reading. Selection lines $W_1$-$W_n$ extending from a line decoder render it possible to respectively select a memory word. In the following, the word i is always to be viewed as the word selected. All remaining words are not to be selected. Non-selected words $W_k$ (k=1 ... m; k≠i) conduct a "0" to the AND gate $502_k$ by way of a line $507_k$. Therefore, the output of the AND gate $502_k$ also provides a "0". Because of the inverter $505_k$, the AND gate $504_k$ has a "1" at the connection $508_k$. The input 516 of the OR gate 514 has a "1" during the entire erase process, for which reason the output of the OR gate 514 also supplies a "1" to the input $509_k$ of the AND gate $504_k$. Therefore, the output of the AND gate $504_k$ emits a "1" to the OR gate $503_k$, for which reason its output again emits a "1". Thereby, the voltage divider 550 is switched off by way of the inverter $500_{k3}$ and a transistor $500_{k1}$, whereas the gate voltage $U_{Gk}$ is connected to the voltage of the point 515 by way of the transistor $500_{k2}$. An input 521 of the NOR gate 523 carries a "1" during the duration of the erase pulses, for which reason the output of the gate 523 carries a "1" during the duration of the erase pulses, for which reason the output of the gate 523 provides a "0". Thereby, the transistor 520 is blocked and the gate voltage of the $k^{th}$ line $U_{Gk}$ has the voltage of the point 515. The potential $U_{Gk} \approx U_G \approx 25$ volts is true for a given negigible resistance 510. In the erase pulse pauses, on the other hand, both inputs of the NOR gate 523 exhibit a "0", for which reason its output emits a "1". Thereby, the transistor 520 is connected through and the voltage of the point 515 which is, at the same time, approximately the voltage $U_{Gk}$, exhibits a value of approximately 0 volt. The line $507_i$ receives a "1" for a selected word i by way of the selection line $W_i$ of an appertaining line decoder. The input $506_i$ exhibits a "0" during the entire erase phase, since the output of the AND gate 511 always supplies a "0" during the entire erase phase since, again the input 531 supplies a "1" only during the write phase and always supplies a "0" at all other times. The output of the AND gate $502_i$, therefore, emits a "0" to the input of the OR gate $503_i$. The AND gate $504_i$, likewise, applies a "1" to the second input of the OR gate $503_i$, since the "1" at the input $507_i$ is converted into a "0" at the output $508_i$ by means of the inverter $505_i$. The output of the OR gate $503_i$, therefore, emits a "0", for which reason the transistor $500_{i2}$ is blocked, whereas the transistor $500_{i1}$ is rendered conductive by means of the inverter $500_{i3}$, so that the gate voltage $U_{Gi}$ is connected to the voltage divider 550. During the erase pulses, a voltage approximately 0 volt occurs at the output of the voltage divider 550, since the transistor 567 is connected through during the erase pulses, which voltage of approximately 0 volt, therefore, also appears as the gate voltage $U_{Gi}$. During the pulse pauses upon erasing, the transistor 567 is blocked. The transistors 556 and 565 are blocked during the entire erase duration. Therewith, the voltage $U_{GL}$ occurs at the output 551 of the voltage divider in the erase pulse pauses by way of the through-connected transistor 564, which voltage $U_{GL}$ at the same time also supplies the gate voltage $U_{Gi}$. With this voltage $U_{GL}$ at the gate of the selected word i, the read-after-write test is carried out in the pulse pauses.

During the total write process, the input $507_k$ always carries a "0" for a nonselected word. Therefore, the AND gate $502_k$ also emits a "0" to one input of the OR gate $503_k$. By contrast, the AND gate $504_k$ emits a "1" to the second input of the OR gate $503_k$ in the write pulse pauses, since the input $508_k$ of the AND gate $504_k$ always produces a "1" by means of the inverter $505_k$ and the input $509_k$ likewise brings a "1" in the write pulse pauses. In the write pulse pauses, in particular, the inverter 512 emits a "1" to the input 533 of the AND gate 513. During the entire write process, a "1" appears at the second input 532 of the AND gate 513. Therefore, the AND gate 513 emits a "1" to the input 517 of the OR gate 514, which in turn effects a "1" at the output of the OR gate 514 and, therefore, a "1" at the input $509_k$ of the AND gate $504_k$. During the write pulses, on the other hand, a "0" appears at the input $509_k$ of the AND gate $504_k$, so that both inputs of the OR gate $503_k$ have a "0" applied thereto so as to provide a "1" at the output during the write pulses. During the write pulses, therefore, the gate lines of nonselected words are connected by way of the transistor $500_{k1}$ with the voltage divider 550 because of the inverter $500_{k3}$, whereas the gate lines of nonselected words lie at the voltage of the point 515 by way of the transistor $500_{k2}$ in the write pulse pauses. In the write pulse pauses, the transistor 520 is connected through, since the NOR gate 523 supplies a "1" at the output because both of its inputs have a "0" applied thereto. In the pulse pauses, therefore, the gate voltage $U_{Gk}$ of nonselected words is approximately equal to 0 volt. During the write pulses, on the other hand, the gates of the nonselected words are connected by way of the transistor $500_{k1}$ with the output 551 of the voltage divider 550 because of the "0" at the output of the OR gate $503_k$ and the inverter $500_{k3}$. During the entire write phase, only the relatively low voltage $U_{GS}$, i.e. the gate voltage upon the read-after-write test during the writing operation, is applied at the output 551 by way of the through-connected transistor 566. The transistor 564, 565 and 567 of the voltage divider 550 are blocked during the entire write phase.

Given a selected word i, the "1" applied at the input $507_i$ is inverted by way of the inverter $505_i$ into a "0" at the connection $508_i$ of the AND gate $504_i$, so that the AND gate $504_i$ emits a "0" to the OR gate $503_i$. The AND gate 511 receives a "1" via the input 531 during the entire write phase. The AND gate 511 receives a further "1" by way of the input 530 during the duration of the write pulses and a "0" during the write pulse pauses. Therefore, the AND gate 511 emits a "1" to the input $506_i$ of the AND gate $502_i$ during the duration of the write pulses and emits a "0" to the input $506_i$ of the AND gate $502_i$ during the duration of the write pulse pauses. Since the input $507_i$ of the AND gate $502_i$ always has a "1" as a selected word, the AND gate $502_i$ therefore emits a "1" to the input of the OR gate $503_i$ during the duration of the write pulses and a "0" to the input of the OR gate $503_i$ during the duration of the write pulse pauses. During the write interval, the second input of this OR gate, as has been shown, always has a "0" applied thereto. Therefore, during the interval of the write pulses, the "1" is applied at the output of the OR gate $503_i$, for which reason the gate voltage $U_{Gi}$ is applied to the point 515, by way of the transistor $500_{i2}$. Since the input 522 of the NOR gate 523 carries a "1" during the write pulse duration, its output exhibits a "0", for which reason the transistor 520 is blocked. Therefore, a voltage of approximately 25 volts is applied at the point 515, which corresponds to the gate voltage $U_{Gi}$. During the write pulse pauses, on the other hand, the gate of a selected word i is applied by way of the through-connected transistor $500_{i1}$ to the voltage divider 550 at whose output 551 the voltage $U_{GS}$ the gate voltage upon read-after-write test during the writing, is applied because of the through-connected transistor 566. All other transistors, the transistor 565, 564 and 567 of the voltage divider 550 are blocked during the write pulse pauses.

During reading out a selected word i, the connection 506$_i$ of the AND gate 502$_i$ always carries a "0", since the inputs 530 and 531 of the AND gate 511 always exhibit a "0", for which reason the output of the AND gate 511 and, therefore, the input 506$_i$ of the AND gate 502$_i$ also always exhibits a "0".

The AND gate 502$_i$, therefore, always supplies a "0" to the OR gate 503$_i$. By means of the inverter 505$_i$, the input 508$_i$ of the AND gate 504$_i$ always receives a "0", for which reason its output likewise always supplies a "0" to the OR gate 503$_i$. Thereby, the output of the OR gate 503$_i$ always carries a "0" for the entire reading phase, i.e. the transistor 500$_{i2}$ is always blocked, whereas the transistor 500$_{i1}$ is conductive as a result of the inverter 500$_{i3}$ and, therefore, connects the selected gate line with the voltage divider 550. During the reading phase, the transistors 567, 564 and 566 are blocked in the voltage divider 550. Therefore, the gate reading voltage $U_{GR}$ is applied at the output 551 of the voltage divider 550.

In the case of a nonselected word k, the input 508$_k$ of the AND gate 504$_k$ lies at "1" as a result of the inverter 505$_k$; the second connection 509$_k$ of the AND gate likewise carries a "1", since the output of the OR gate 514 likewise carries a "1" as a result of a "1" at the input 518. Therefore, the OR gate 503$_k$ always exhibits a "1" at its output for nonselected words, for which reason the voltage divider 550 is separated from the appertaining gate line, whereas the voltage of the point 515 is applied to the appertaining gate line by way of the transistor 500$_{k2}$. Since both inputs 521 and 522 of the NOR gate 523 each carry a "0", "1" is produced at the output of this gate. The transistor 520, therefore, is connected through. The voltage of the point 515 and, therefore, the voltage of a nonselected gate, as well, thus amounts to approximately 0 volt during the entire reading duration.

The resistors 571, 572, 573, 574 of the voltage divider 550 can either be diffused resistors or field effect transistors of enhancement type in a saturated or unsaturated condition; however, they can also be field effect transistors of the depletion type. The connection of the resistor 571 which is not connected with the resistor 572 is grounded. The connection of the resistor 574 which is not connected with the resistor 573 is connected to a supply voltage which is greater than $U_{GL}$, the gate voltage upon a read-after-write test during the erasure the voltage difference $U_{GS}$-$U_{GL}$, the so-called write-/read window, depends in its dimensioning on the memory technology employed. Given the memory types most often employed, the write-read window amounts to approximately 1–6 volts. The employment of a voltage divider as illustrated in FIG. 4 guarantees safe intervals between the read-after-write test voltages employed—both during writing and during erasure—and the reading voltage, so that an unprogrammed cell can be securely differentiated from a programmed cell. The relative position of the voltage to one another is guaranteed by means of such a voltage divider. Different write and erase properties of the memory cells within a memory which are tolerance-conditioned have no effect on the reliability upon reading, but rather only on the duration of the write or, respectively, the erase process. The width of the electric window $U_{GS}$-$U_{GL}$ can, due to the voltage divider 550, be kept relatively small, since the conditions "0" and "1" are very precisely prescribed with respect to the reading voltage. Thereby, either the voltages during the programming can be low or the reprogramming is accomplished particularly quickly. Further, by means of the employment of the voltage divider 550, the electric window can be displaced into a specific, desired threshold voltage range of the memory cells employed.

In FIG. 4, moreover, the source-drain control 200 is illustrated for a split gate memory cell which is charged with the channel injection and is discharged by means of a strong electric potential between the control gate and a diffusion area.

The drain control 220 for the i$^{th}$ column (i=1 ... n) is formed by means of a transistor 210$_i$ and a transistor 209$_i$ connected in parallel thereto. The transistor 210$_i$ is always connected through and is dimensioned in such a manner that a small current always flows therethrough, which current is sufficient for reading or for the read-after-write test, but which, however, is not sufficient for programming a cell. With its output 211$_i$, an AND gate 208$_i$ controls the gate of the transistor 209$_i$, so that the transistor 209$_i$ carries current which supplies the programming current for a programming cell when both a data input in the i$^{th}$ line (D$_{Ei}$) occurs, i.e. the input 213$_i$ therefore exhibits a "1" and a write pulse occurs, i.e. T$_S$ applies a "1" to the input 212. If one ignores the resistance of the transistor 209$_i$, the drain voltage of the i$^{th}$ column amounts to $U_{Di} \approx U_D \approx 17$ volts. Given all other possible memory processes, for example, in the write pulse pauses, during the entire erase duration and during the reading duration, the transistor 209$_i$ is not conductive, so that no programming current can flow into the drain lines of the i$^{th}$ column.

The source control 250 for a split gate memory cell which is charged with channel injection and is discharged by means of a strong electric field between the control gate and a diffusion area is common to all source lines. The source control 250 comprises a resistor 256 which is connected at one end with the drain of a transistor 258 whose source 261 is grounded, and the other end 255 of the resistor 256 is connected to a potential $U_{SS}$ which is in the range of 25–40 volts. The gate of the transistor 258 is driven by way of an inverter 259 during the duration of the erase pulses $T_L$. The transistor 258, therefore, is blocked during each erase pulse. Therefore, given a blocked transistor 258, a voltage $U_S \approx U_{SS}$=25–40 volts is provided at a point 257, at which the source voltage $U_S$ is tapped for all columns. This relatively high positive source voltage is also only required during the erase pulses for the example of a memory cell selected in FIG. 4. In the split gate memory cell on which FIG. 4 is based, a high positive voltage is applied to the source during the erase pulses, whereas the control gate at that time exhibits a voltage of 0 volt. At all other times outside of the erase pulses, the transistor 258 is conductive, the potential at the point 257 and, at the same time, the source voltage $U_S$ amounts to approximately 0 volt.

FIG. 5 illustrates a source and drain control for a memory constructed in accordance with the invention of memory cells which are charged and discharged by means of the application of high electric fields between the control gate and a diffusion area. The gate control occurs in a manner analogous to that illustrated in FIG. 4.

The drain voltages $U_{Di}$ (i=1 ... n) are connected with a supply voltage $V_{DD}$ by way of a constantly through-connected respective transistor 270, such as the transistor $270_i$.

Since, in the examplary embodiment under consideration, the erasing and programming is carried out between the channel area and the gate by way of the source connection, the source is correspondingly elaborate. In the erase process, $T_S=0$ volt, for which reason the input $286_i$ of an AND gate $285_i$ exhibits a "0" in the source control of the $i^{th}$ column. The AND gate $285_i$, therefore, exhibits a "0" at the output and at the input $284_i$ of a NOR gate $281_i$ at the same time. The second input $283_i$ exhibits a "1" during the erase pulses and, otherwise, a "0". Therefore, a "0" is provided at the output $282_i$ of the NOR gate $281_i$ during the erase pulses $T_L$, for which reason the transistor $271_i$ is blocked during the erase pulses, whereas this transistor is connected through during the erase pulse pauses. During the erase pulse duration $T_S$, therefore, the voltage of a point 290 is applied to the source line lines by way of a resistor $277_i$ as a source voltage $U_{Si}$. Since during $T_S$ the voltage is equal to 0 volt, the transistor 272 is blocked and since, at the same time, the voltage during $T_L$ is equal to 0 volt, the transistor 273 is also blocked. Therefore a voltage $U_p$, which is approximately 20-40 volts, appears at the point 290. On the other hand, during the erase pulse pauses a voltage of $U_{Si}$ approximately equal to 0 volt is provided as a result of the through-connected transistor $271_i$.

In the write process, first, the condition during the write pulses for a column i having a cell of a selected word is viewed into which an information is to be written, i.e. $T_S=1$; $D_{Ei}=1$. The input $287_i$ of the AND gate $285_i$ receives a "0" by way of the inverter $289_i$. The output $284_i$ of the AND gate $285_i$ therefore supplies a "0" to an input of the NOR gate $281_i$. The second input $283_i$ likewise carries a "0", since $T_L=0$. The output $282_i$ of the NOR gate $281_i$, therefore, carries a "1" and switches the transistor $271_i$ through during the duration of the write pulses $T_S$. The source voltages $U_{Si}$, in whose column a cell is to be written, thus amounts to $U_{Si} \approx 0$ volts.

The transistor $271_i$ is also connected through during the duration of the write pulse pauses, since in this case, only both inputs of the AND gate $285_i$ exhibit a "0", whereby the output signal of that gate is not changed. Therefore, $U_{Si} \approx 0$ volts is also true.

In a column k, in which no information is to be written into the selected cell, $D_{Ek}=0$ holds true. Because of the inverter $289_k$, therefore, a "1" is always applied to the input $287_k$. A "1" is likewise respectively applied at the second input $286_k$ of the AND gate $285_k$ during the duration of a write pulse. During the remaining time, a "0" is applied. Therefore, a "1" is always applied to the input $284_k$ of the OR gate $281_k$ during the duration of write pulses and, otherwise, a "0". Since $T_L=0$ during the entire write phase, the second input $283_k$ of the OR gate $281_k$ always carries a "0" during the write phase. Therefore, the output $282_k$ of the NOR element $281_k$ emits a "1" in the write phase during the write pulse pauses, i.e. the transistor $271_k$ is connected through which means, in turn, that the source voltage $U_{Sk}=0$ volts. On the other hand, during the duration of the write pulses, the NOR gate $281_k$ emits a "0" at the output $282_k$, for which reason the transistor $271_k$ is blocked. In this case, the source voltage $U_{Sk}$ is at the potential of the point 290 by way of the resistor $277_k$. During the duration of the write pulses, i.e. $T_S$ is not equal to zero, the transistor 272 is connected through, whereas the transistor 273 is blocked because of the intervening NOR gate 276. Since the resistances 274 and 275 are of equal size, the voltage of the point 290 amounts to $U_P/2$, where $U_P$ is equal to 20-40 volts. Therefore, during the duration of the write pulses, the source voltage $U_{Sk}$ for a column k having a selected cell into which no information is to be written amounts to $U_{Sk} \approx U_P/2$ when the voltage drop at the resistor $277_k$ is ignored.

During the duration of a reading process, the data inputs are 0; therefore, a "1" lies at the input $287_i$ by way of the inverter $289_i$ (i=1 ... n) and, because, $T_S=0$, a "0" is applied at the input $286_i$ of the AND gate $285_i$, for which reason the output of this gate applies a "0" to the input $284_i$. Since an erasure is not being carried out at the same time, a "0" is likewise applied to the second input $283_i$ of the NOR gate $281_i$, for which reason the output $282_i$ of the NOR gate $281_i$ applies a "1" to the gate of the transistor $271_i$. Therefore, the transistor $271_i$ is connected through. The source voltage thus amounts to $U_{Si} \approx 0$ volts during the reading phase.

The drain lines, connected bit-wise, all always lie at the same potential $V_{DD}$ by way of the through-connected transistors $270_i$ (i=1 ... n).

Finally, it is revealed that the gate, source and drain controls described in FIGS. 4 and 5 supply the corresponding erase, or, respectively, write or, respectively, read conditions for the cases respectively employed. In both types of memory cells according to FIGS. 4 and 5, the erasure is respectively carried out in that a high positive voltage is applied to the source and a voltage of 0 volt is applied to the gate. According to FIG. 4, the voltage $U_{SS}$ which is approximately 25-40 volts is applied as a voltage at the individual source lines, connected bit-wise, during the duration of the erase pulses. In the case of FIG. 5, the voltage $U_{Si} \approx U_P$ in the range of 20-40 volts (i=1 ... n) is respectively applied at the source lines which are connected on a bit basis. During the duration of the erase pulses, a voltage of $U_{Gi} \approx 0$ volt is applied to the gate line of a selected word, whereas a high positive voltage of $U_{Gk} \approx 25$ volt is applied at the gate lines of the nonselected words. Thereby, only the selected word is erased during the erase pulses, whereas the adjacent words are not influenced. In the erase pulse pauses, all source lines of FIGS. 4 and 5 are connected to a voltage of approximately $U_{Si} \approx 0$ volt. A relatively small positive feed voltage $U_{GL}$, which is so small that no information can be written therewith, is applied to the gate line of the selected words. The gate lines of nonselected words likewise lie at a potential of approximately $U_{GK} \approx 0$ volt. Therefore, the selected words are erased during the duration of the erase pulses and adjacent word interference is securely suppressed.

During the duration of the write pulses, a high positive voltage, for example, 25 volts, is connected to the gate line of a selected word, whereas a voltage of approximately 0 volt is connected to the gate lines of the nonselected words.

In the memory cells of FIG. 4, a high channel current which is sufficient for programming the cell simultaneously flows in the columns in which a cell is to be written is located, whereas only a very minimum channel current flows in those columns whose selected cells are to receive no information, the latter current only being employed as a read current which is not sufficient for charging a cell. Given those bits having high channel current, nothing is written into nonselected adjacent words, since the gate voltage at the noselected words at the same time amounts to $U_{Gk} \approx 0$ volt. During the write pulse pauses, the gate voltage of nonselected words amounts approximately to 0 volt, whereas the gate voltage of the selected word exhibits a small positive read-after-write test voltage $U_{GS}$. The high channel current is likewise switched off during the write pulse pauses. Only a few small channel current flows, which is sufficient for reading or, respectively, a read-after-write test, but which is not sufficient for writing information. Because of the simultaneously different gate voltages of a selected word with respect to gate voltages of the nonselected words, one in fact only reads at the cells of the selected word.

The cells of a memory according to FIG. 5 are charged by means of the application of a high voltage between the control gate and a diffusion area, for example, the source. During a write pulse, a high positive voltage of approximately 25–40 volts is applied to the gate line of a selected word, whereas a very small positive voltage lies at the gate lines of the nonselected words, the latter voltage being insufficient for writing information into the cell and, for example, corresponds to the read-after-write test voltage during writing $U_{GL}$. At the same time, a voltage of approximately 0 volt lies at the source in those columns into which information is to be inscribed in the selected cell. All other source lines, in which no cell is to be inscribed is located, at the same time exhibit a positive voltage of $U_P/2$. The different voltages between selected words and nonselected words guarantee that information is written into the selected cell, whereas information is not written into adjacent cells of the same bit. Given bits into which no information should be written, the potential difference between the gate and the source is precisely dimensioned such that it is not sufficient for writing information, for example, and amounts to $U_P/2$. Thereby, it is assured that, in fact, no information is written into all cells of a bit whose source lines are charged with a potential $U_P/2$.

During the write pulse pauses, the read-after-write test voltage during writing $U_{GS}$ is applied to the selected gates, this voltage corresponding to a small positive voltage. A voltage of approximately 0 volt is applied to all adjacent gate lines. At the same time, a voltage of 0 volt is applied to all source lines and a small read current flows between the source and the drain. Thereby, it is assured that a read-after-write test is carried out only in those cells of a selected word.

Upon reading, the reading voltage $U_{GR}$ is applied to the gate of the selected word. The voltage of nonselected words during reading amounts to 0 volt.

For cells which are charged and discharged by means of high electric fields between the control gate and the diffusion area, for example, the source, a source control similar to that illustrated in FIG. 5 can be developed which guarantees that the potential difference between the control gate and the source of nonselected cells only amounts to one-third of the potential difference which is applied for the writing into selected cells between the control gate and the source. Such a modification of the source control illustrated in FIG. 5 could be achieved by means of a suitable dimensioning and connection of the resistors 274 and 275 of FIG. 5. In addition, the elements 520 and 510 of the gate control would be changed. Such a modification could be derived from FIG. 5 upon employment of the control conditions as described in my aforementioned patent application Ser. No. 942,320, filed Memories constructed in accordance with the present invention may advantageously be employed as tuning memories in television devices, for number memories in telephone exchange systems, as well as for program memories in microcalculators.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications which may reasonably be included within the scope of my contribution to the art.

I claim:

1. A word-by-word electrically reprogrammable nonvolatile memory comprising:
   a matrix including
   a plurality of memory cells, each of said memory cells being chargeable and dischargeable to predetermined states including write and erase states;
   a plurality of memory lines connected to said memory cells;
   state control means, including voltage producing means, connected to said memory lines for selectively operating said memory cells towards said predetermined states; and
   monitoring means connected to said memory cells and to said state control means for monitoring the charge state of said memory cells and terminating operating of said state control means in response to the monitored cells attaining said predetermined states and thereby providing variable duration state control signals.

2. The memory of claim 1, wherein:
   said voltage producing means comprises means for producing an erase voltage as a temporal sequence of time-spaced erase pulses; and
   further comprising:
   read-after-write test means connected to said lines for performing a read-after-write test in the time spaces between the erase pulses.

3. The memory of claim 2, wherein each of said memory cells has a predetermined threshold value and wherein said monitoring means includes means operable, during a read-after-write test, in response to a predetermined voltage on the tested memory cells to produce a termination signal to said state control means to terminate the variable duration of a control signal, the predetermined voltage being less than the predetermined threshold value.

4. The memory of claim 1, comprising:
   erase means in said state control means for applying a continuous erase voltage to a selected line; and
   read-after-write test means simultaneously connected to the cells of a selected line for determining and indicating when the voltage of the cells of the selected line fall below a predetermined value.

5. An electrically reprogrammable nonvolatile memory comprising:
   a matrix comprising a plurality of word lines, a plurality of first bit lines, a plurality of second bit lines and a plurality of memory cells, each of said memory cells including a field effect transistor comprising a gate, a source and drain, said gates connected to said word lines, said sources connected to said first bit lines and said drains connected to said second bit lines, each of said memory cells being charged to a first predetermined level above a second predetermined level to store a first binary value and discharged to a third predetermined level below a fourth predetermined level to store a second binary value;

monitoring means connected to said memory cells for monitoring the charge level of said memory cells and providing signals indicating the change of charge state from one binary value to another; and control means connected to said word lines, to said first and second bit lines and to said monitoring means, and operable to provide selective voltages to said memory cells, on a word basis, and and responsive to said signals from said monitoring means to terminate the application of the selected voltage after variable durations determined by when the charge level signifies a change of charge state from one binary value to another.

6. The nonvolatile memory of claim 5, wherein:
said control means includes means for applying the selected voltages as a temporal sequence of individual spaced pulses; and
said monitoring means includes means for monitoring the charge state in the pauses between said individual pulses.

7. The nonvolatile memory of claim 5, wherein:
said control means includes means for providing said selected signals as temporally continuously applied voltages; and
said monitoring means includes means for simultaneously monitoring the charge state of the memory cells.

8. The nonvolatile memory of claim 5, wherein:
said monitoring means is connected to said second bit lines for monitoring drain voltage and produces the monitor signals in respect to a decrease of the absolute value of the drain voltage to the fourth predetermined level.

9. The nonvolatile memory of claim 5, wherein:
said monitoring means is connected to said second bit lines to monitor drain voltage and is responsive to an increase of the drain voltage to the second predetermined level to produce the monitor signal.

10. The nonvolatile memory of claim 5, wherein:
each of said field effect transistors is a floating gate field effect transistor.

11. The nonvolatile memory of claim 5, wherein:
each of said field effect transistors is a metal-nitrideoxide-semiconductor field effect transistor.

12. The nonvolatile memory of claim 5, wherein:
said control means comprises:
means for applying reading voltages to said memory cells, including a voltage divider and means for deriving said selected voltages including said reading voltage from said voltage divider.

13. The nonvolatile memory of claim 5, wherein:
said control means applies said selected voltages to the electrodes of said memory cells; and
wherein said monitoring means includes means responsive to produce said monitor signals when the monitored voltage is less than or equal to the gate voltage.

* * * * *